(12) United States Patent
Hong et al.

(10) Patent No.: US 11,579,183 B2
(45) Date of Patent: Feb. 14, 2023

(54) TEST BOARD AND SEMICONDUCTOR DEVICE TEST SYSTEM INCLUDING THE SAME

(71) Applicant: SAMSUNG ELECTRONICS CO., LTD., Suwon-si (KR)

(72) Inventors: Minseok Hong, Suwon-si (KR); Minsuk Choi, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/315,530

(22) Filed: May 10, 2021

(65) Prior Publication Data

US 2022/0082609 A1    Mar. 17, 2022

(30) Foreign Application Priority Data

Sep. 17, 2020  (KR) .................. 10-2020-0120040

(51) Int. Cl.
*G01R 31/27* (2006.01)
*G01R 31/28* (2006.01)

(52) U.S. Cl.
CPC .......... *G01R 31/27* (2013.01); *G01R 31/2834* (2013.01)

(58) Field of Classification Search
None
See application file for complete search history.

(56) References Cited

U.S. PATENT DOCUMENTS

| | | | |
|---|---|---|---|
| 7,088,122 B2 | 8/2006 | Hartmann et al. | |
| 7,671,617 B2 | 3/2010 | Song | |
| 8,326,565 B2 | 12/2012 | Daub et al. | |
| 8,981,808 B2 | 3/2015 | Nishioka | |
| 9,224,500 B2 | 12/2015 | Ho et al. | |
| 10,162,002 B2 | 12/2018 | Berge et al. | |
| 10,410,686 B2 | 9/2019 | Park et al. | |
| 10,528,493 B2 | 1/2020 | Berge et al. | |
| 2011/0291679 A1* | 12/2011 | Pagani | G01R 31/3172 324/750.01 |
| 2013/0342236 A1* | 12/2013 | Song | G01R 31/31926 324/756.07 |
| 2020/0003829 A1* | 1/2020 | Lambert | G01R 31/2879 |
| 2021/0190828 A1* | 6/2021 | Brecht | G01R 31/2834 |

FOREIGN PATENT DOCUMENTS

| | | | | |
|---|---|---|---|---|
| KR | 10-1993-0022382 | | 11/1993 | |
| WO | WO-2013130088 A1 | * | 9/2013 | ............ H02M 3/158 |

* cited by examiner

*Primary Examiner* — Patrick Assouad
*Assistant Examiner* — Haidong Zhang
(74) *Attorney, Agent, or Firm* — F. Chau & Associates, LLC

(57) ABSTRACT

A test board configured to test a device under test includes: a connection region including first and second connection terminals for contacting the device under test; and a first surface mount device located adjacent to the connection region, wherein the first connection terminal is configured to be electrically connected to a first voltage regulator of the device under test, wherein the second connection terminal is configured to be electrically connected to a second voltage regulator of the device under test, and wherein the first surface mount device is configured to be electrically connected to each of the first and second connection terminals.

18 Claims, 8 Drawing Sheets

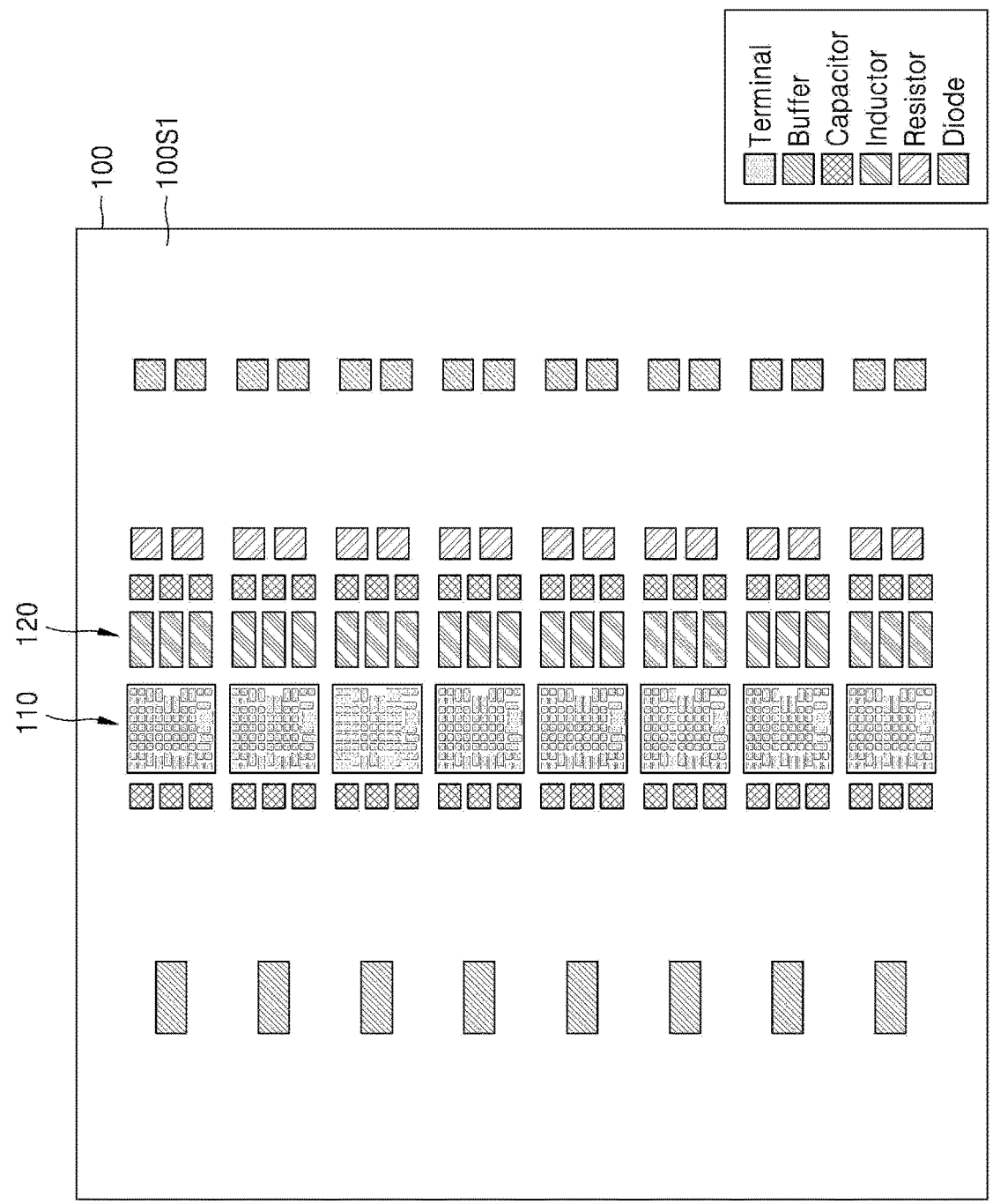

TEST BOARD AND SEMICONDUCTOR DEVICE TEST SYSTEM INCLUDING THE SAME

CROSS-REFERENCE TO RELATED APPLICATION

This application claims priority under 35 U.S.C. § 119 to Korean Patent Application No. 10-2020-0120040, filed on Sep. 17, 2020, in the Korean Intellectual Property Office, the disclosure of which is incorporated by reference herein in its entirety.

TECHNICAL FIELD

The present inventive concept relates to a test board and a semiconductor device test system including the test board.

DISCUSSION OF THE RELATED ART

With the desire for increasing performance and integration of semiconductor devices, the design complexity of test boards for interconnection between automatic test equipment and a device being tested is increasing.

For example, in the case of a device being tested, which inputs and/or outputs an analog signal, a plurality of passive devices may be arranged as surface-mounted devices adjacent to a connection region for the device being tested. Due to a space limitation on the test board, the number of devices that can be simultaneously tested may be limited.

SUMMARY

According to an exemplary embodiment of the present inventive concept, a test board configured to test a device under test includes: a connection region including first and second connection terminals for contacting the device under test; and a first surface mount device located adjacent to the connection region, wherein the first connection terminal is configured to be electrically connected to a first voltage regulator of the device under test, wherein the second connection terminal is configured to be electrically connected to a second voltage regulator of the device under test, and wherein the first surface mount device is configured to be electrically connected to each of the first and second connection terminals.

According to an exemplary embodiment of the present inventive concept, a test board includes: a first connection region including a first output terminal and a second output terminal, wherein the first output terminal is configured to receive an output signal from a first voltage regulator of a first device under test, wherein the second output terminal is configured to receive an output signal from a second voltage regulator of the first device under test, and wherein the test board is electrically connected to the first device under test; a second connection region including a third output terminal and a fourth output terminal, wherein the third output terminal is configured to receive an output signal from a first voltage regulator of a second device under test, and wherein the fourth output terminal is configured to receive an output signal of the second voltage regulator of the second device under test, and wherein the test board is electrically connected to the second device under test; a first surface mount device located adjacent to the first connection region; and a second surface mount device located adjacent to the second connection region, wherein the first surface mount device is connected to each of the first and second output terminals, and wherein the second surface mount device is connected to each of the first and second output terminals.

According to an exemplary embodiment of the present inventive concept, a semiconductor device test system including: a test board configured to be electrically connected to a device under test; and an automatic test circuit configured to provide a power supply potential and a reference potential to the test board, and to determine a defect of the device under test based on a received analog output voltage from the device under test; wherein the test board includes: a first connection region located on the test board and including a plurality of connection terminals; and a first passive element located adjacent to the first connection region on the test board, wherein the plurality of connection terminals include a plurality of power terminals configured to receive the power supply potential, a plurality of reference terminals configured to receive the reference potential, and a plurality of output terminals configured to receive the analog output voltage, and wherein the first passive element is connected to each of the plurality of output terminals.

BRIEF DESCRIPTION OF THE DRAWINGS

The above and other features of the present inventive concept will become more apparent by describing in detail exemplary embodiments thereof, with reference to the accompanying drawings, in which:

FIG. 3A is a plan view illustrating a test board according to an exemplary embodiment of the present inventive concept;

DETAILED DESCRIPTION OF THE EMBODIMENTS

Figure 1:
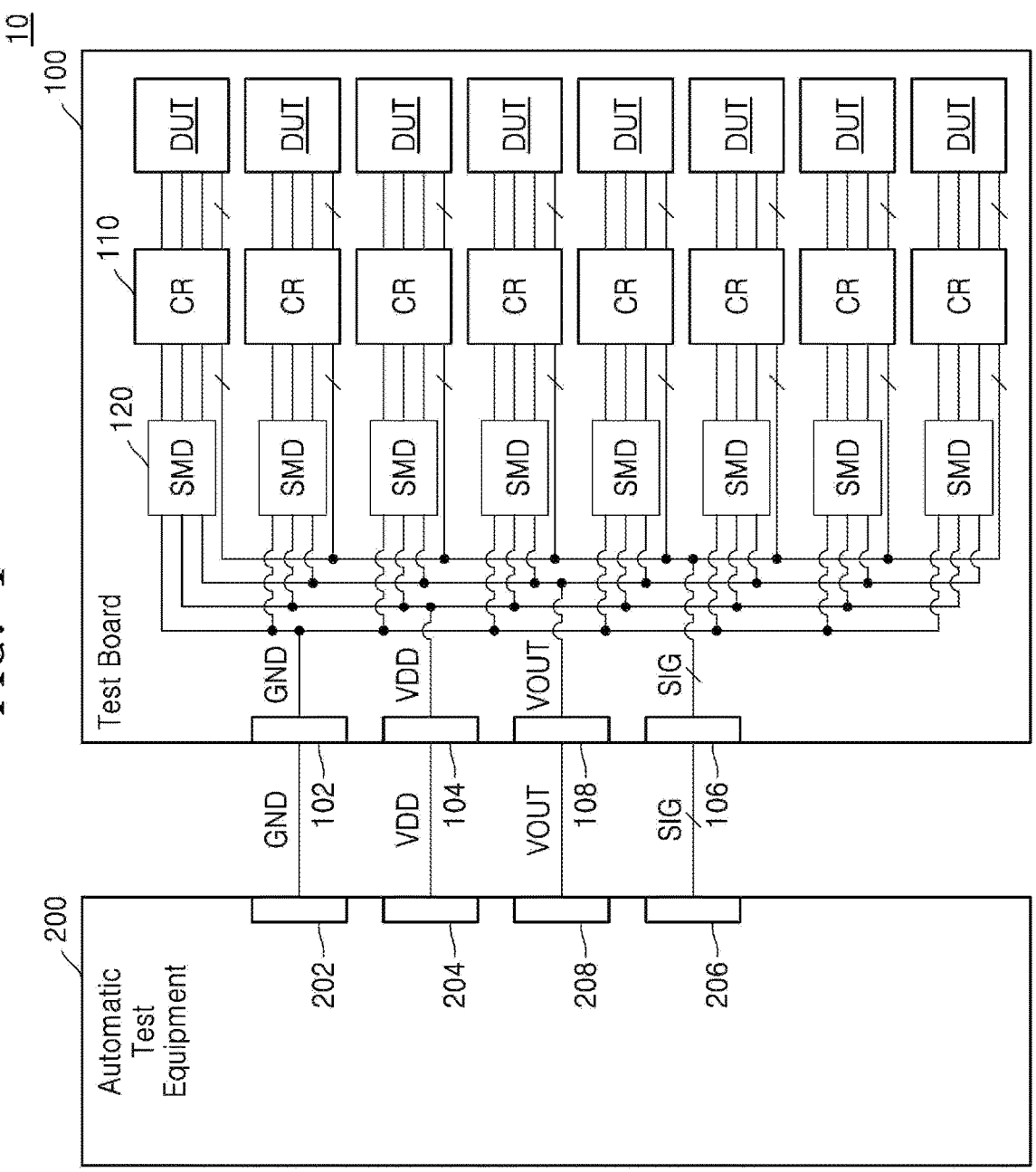
FIG. 1 is a block diagram illustrating a semiconductor device test system according to an exemplary embodiment of the present inventive concept.

Hereinafter, exemplary embodiments of the present inventive concept will be described in detail with reference to the accompanying drawings. It is to be understood that the same reference numerals are used for the same elements in the drawings, and redundant descriptions thereof may be omitted in the specification.

FIG. 1 is a block diagram illustrating a semiconductor device test system 10 according to an exemplary embodiment of the present inventive concept.

Referring to FIG. 1, a semiconductor device test system 10 according to an exemplary embodiment of the present inventive concept may include a test board 100 and an automatic test equipment ATE 200.

The automatic test equipment 200 may automatically test devices under test DUT. The automatic test equipment 200 may be configured as, for example, a microprocessor-based system. For example, the automatic test equipment 200 may be a circuit.

According to an exemplary embodiment of the present inventive concept, the devices under test DUT may be analog devices that operate based on an analog signal or output an analog signal. According to an exemplary embodiment of the present inventive concept, the devices under test DUT may include voltage regulators such as a buck regulator, a low drop-out (LDO) regulator, and a boost regulator. According to an exemplary embodiment of the present inventive concept, the devices under test DUT may be any one of a digital to analog converter (DAC), an analog to digital converter (ADC), a phase locked loop (PLL), and a power management integrated circuit (PMIC). According to an exemplary embodiment of the present inventive concept, each of the devices under test DUT may be a device formed in a wafer before being individualized. However, the present inventive concept is not limited thereto, and each of the devices under test DUT may be an individual device that is individualized and packaged after a wafer-level manufacturing process is completed.

Hereinafter, an exemplary embodiment of the present inventive concept such as a PMIC in which the devices under test DUT output analog signals are mainly described, but this is merely an example and does not limit the present inventive concept in any sense. For example, the devices under test DUT may be volatile memory devices such as Static Read Access Memory (SRAM), Dynamic Static RAM (DRAM), Synchronous Static RAM (SSRAM), non-volatile memory devices such as Read Only Memory (ROM), Programmable Read Only Memory (PROM), Erasable PROM (EPROM), Electrically Erasable PROM (EEPROM), Flash memory, Phase-change RAM (PRAM), Magnetoresistive RAM (MRAM), Resistive Random-Access Memory (RRAM), and Ferroelectric RAM (FRAM), and memory components including them. Further, the devices under test DUT may be, for example, logic device such as central processing unit (CPU), graphic processing unit (GPU), application processor (AP), and a field programmable gate array (FPGA).

The automatic test equipment 200 may be electrically connected to the device under test DUT through the test board 100. The automatic test equipment 200 may provide a power supply potential VDD, a reference potential GND, and a test signal SIG to the test board 100. The devices under test DUT may receive the power supply potential VDD, the reference potential GND, and the test signal SIG through the test board 100 and output an output voltage VOUT to the automatic test equipment 200. The automatic test equipment 200 may determine whether the devices under test DUT are defective based on the output voltage VOUT.

The automatic test equipment 200 may include a ground terminal 202, a power terminal 204, a test terminal 206, and a measurement terminal 208. The ground terminal 202 may provide a reference potential GND. The power terminal 204 may provide a power supply potential VDD. The test terminal 206 may provide a test signal SIG, and the measurement terminal 208 may measure the output voltage VOUT of the device under test DUT.

The test board 100 may include a ground terminal 102, a power terminal 204, and a test terminal 106. The ground terminal 102 may receive a reference potential GND from the automatic test equipment 200. The power terminal 104 may receive a power supply potential VDD, and the test terminal 106 may receive a test signal SIG. The test board 100 may include a measurement terminal 108 for measuring the output voltage VOUT of the device under test DUT.

The ground terminal 102, the power terminal 104, the test terminal 106, and the measurement terminal 108 may be connected to the ground terminal 202, the power terminal 204, the test terminal 206, and the measurement terminal 208, respectively. The ground terminal 102, the power terminal 104, the test terminal 106 and the measurement terminal 108 may be connected to the ground terminal 202, the power terminal 204, the test terminal 206 and the measurement terminal through a channel such as a cable, respectively.

According to an exemplary embodiment of the present inventive concept, the ground terminal 102 and the power terminal 104 may apply the reference potential GND and the power supply potential VDD, respectively, to the corresponding connection region 110 via the corresponding surface-mounted devices 120. According to an exemplary embodiment of the present inventive concept, the output voltage VOUT may be applied from the connection region 110 to the measurement terminal 108 via the surface mounted devices 120. According to an exemplary embodiment of the present inventive concept, the test signal SIG may be applied from the test terminal 106 to the connection region 110 without passing through the surface mounted devices 120. However, the present inventive concept is not limited thereto. For example, the test signal SIG may pass through the surface mounted devices 120.

Figure 2:
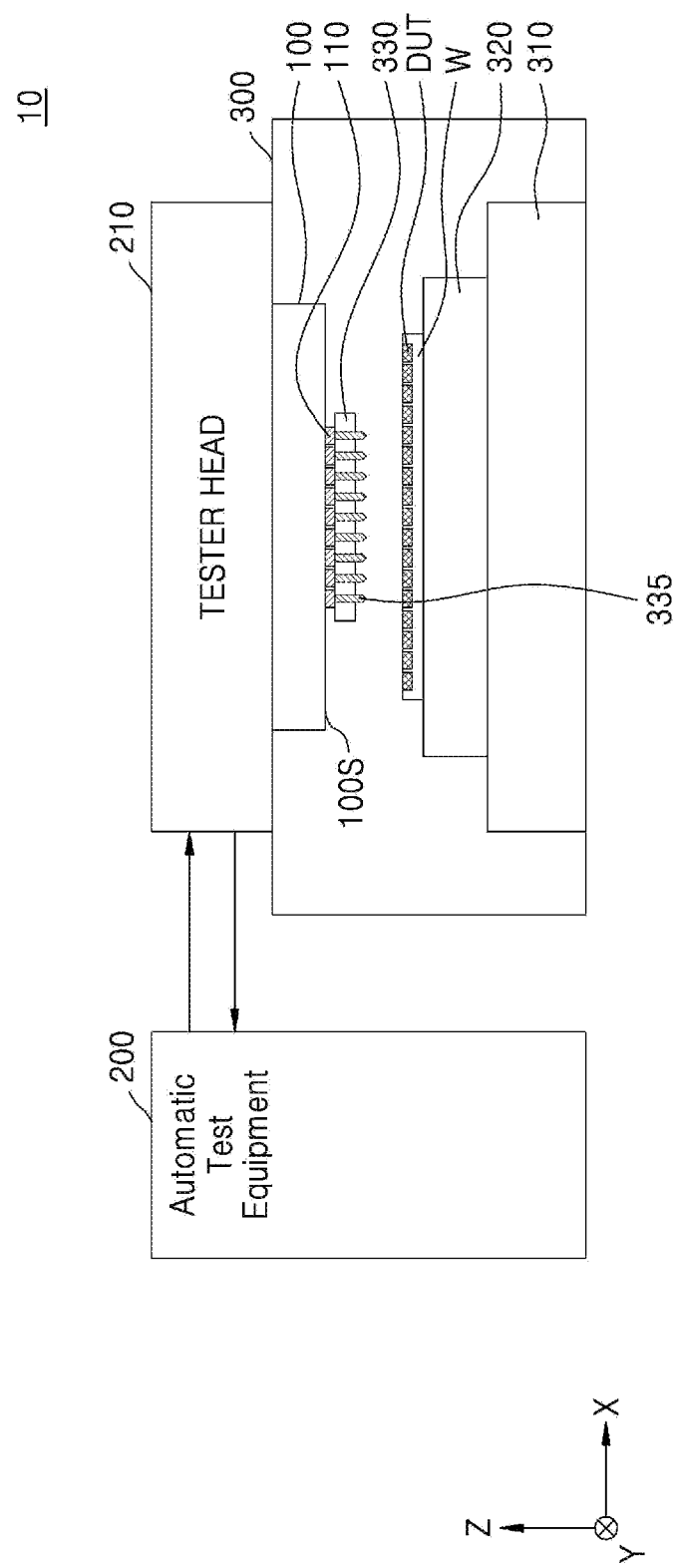
FIG. 2 is a diagram illustrating a semiconductor device test system according to an exemplary embodiment of the present inventive concept.

FIG. 2 is a diagram illustrating a semiconductor device test system 10 according to an exemplary embodiment of the present inventive concept.

Referring to FIGS. 1 and 2, the semiconductor device test system 10 may include a test chamber 300 in addition to the test board 100 and the automatic test equipment 200.

The substrate W may be loaded into the test chamber 300 and tested by the semiconductor device test system 10. Here, the substrate W may be a semiconductor wafer on which a plurality of devices under test DUT are formed. The substrate W may include silicon (Si). The substrate W may include a semiconductor element such as germanium (Ge), or a compound semiconductor such as silicon carbide (SiC), gallium arsenide (GaAs), indium arsenide (InAs), and indium phosphide (InP).

According to an exemplary embodiment of the present inventive concept, the substrate W may have a silicon on insulator (SOI) structure. The substrate W may include a buried oxide layer formed on the surface of the substrate W. According to an exemplary embodiment of the present inventive concept, the substrate W may include a conductive region formed on the surface of the substrate W, for example, a well doped with impurities. According to an exemplary embodiment of the present inventive concept, the substrate W may have various device isolation structures such as shallow trench isolation (STI) separating the doped wells from each other.

According to an exemplary embodiment of the present inventive concept, the substrate W may be loaded on a chuck 320 so that the connection terminals of the devices under test DUT face the test board 100. According to an exemplary embodiment of the present inventive concept, an electric die sorting (EDS) test may be performed in the test chamber 300. Here, for example, the EDS test refers to a process of applying an electrical signal to the devices under test DUT and determining whether or not the semiconductor devices are defective based on the signals output by the devices under test DUT.

According to an exemplary embodiment of the present inventive concept, the EDS test may include a direct current (DC) test and an alternating current (AC) test. Here, the DC test is a test that determines whether the devices under test DUT is defective by applying a predetermined potential to the input terminals of the devices under test DUT and measuring DC characteristics such as open/short, input current, output potential, and power supply current. In addition, the AC test is a test to determine whether the devices under test DUT is defective by applying a pulse signal to the input terminals of the devices under test OUT and measuring the operation characteristics such as input/output transport delay time and start/end time of the output signal.

A chuck actuator 310 and the chuck 320 may be disposed in the test chamber 300. A test socket 330 may be mounted on the test board 100. The connection region 110 of the test board 100 and connection terminals of the device under test DUT may be electrically connected to each other through the test socket 330. The test socket 330 may include a plurality of pins 335 for connecting connection terminals on the connection region 110 of the test board 100 to connection terminals of the device under test DUT. The plurality of pins 335 may be, for example, pogo pins, but the present inventive concept not limited thereto. For example, instead of the pin socket shown in FIG. 2, a silicon rubber socket may be provided.

The chuck 320 may be disposed on the chuck actuator 310, which is a chuck driving device. For example, the chuck 320 may fix the substrate W by static electricity adsorption, vacuum adsorption, or the like. For example, the chuck driving device 310 may be disposed under the chuck 320 and connected to the chuck 320. The chuck driving device 310 may translate the chuck 320 in the X, Y, and Z directions (e.g., vertical and horizontal directions). In addition, the chuck driving device 310 may rotate the chuck 320. Here, the X and Y directions may be two directions that are parallel to the first surface 100S of the test board 100, for example, the surface facing the substrate W within the test chamber 300. The X and Y directions may be substantially perpendicular to each other. The Z direction refers to a direction substantially perpendicular to the first surface 100S of the test board 100. Unless otherwise noted, the definition of the direction is the same for all drawings below. For example, even when only part of the semiconductor device test system 10 (e.g., the test board 100) is shown, the X direction, the Y direction, and the Z direction based on the first surface 100S of the test board 100 are the same as described above.

According to an exemplary embodiment of the present inventive concept, the chuck driving device 310 may rotate the chuck 320 about an axis parallel to the Z direction so that the connection terminals of the devices under test DUT formed on the substrate W are aligned with the connection regions 110 of the test board 100. According to an exemplary embodiment of the present inventive concept, the chuck driving device 310 may move the chuck 320 in the X and Y directions so that the connection terminals of the devices under test DUT formed on the substrate W are vertically aligned with the connection regions 110 of the test board 100. According to an exemplary embodiment of the present inventive concept, the chuck driving device 310 may move the chuck 320 in the Z direction so that the connection terminals of the devices under test DUT formed on the substrate W are electrically or physically connected to corresponding connection regions 110 of the test board 100.

According to an exemplary embodiment of the present inventive concept, the test board 100 may be connected to the automatic test equipment 200 through a tester head 210. Accordingly, the electric signal generated by the automatic test equipment 200 may be transmitted to the test board 100 through the tester head 210. However, the present inventive concept is not limited thereto, and the automatic test equipment 200 may directly transmit a signal to the test board 100.

According to an exemplary embodiment of the present inventive concept, the automatic test equipment 200 may output electrical signals for testing electrical characteristics of the devices under test DUT formed on the substrate W. According to an exemplary embodiment of the present inventive concept, the electrical signal output by the automatic test equipment 200 may be applied to the devices under test DUT formed on the substrate W through the tester head 210 and the test board 100. The devices under test DUT may perform an operation according to the applied electrical signal and generate an output voltage VOUT. The output voltage VOUT generated by the devices under test DUT may be transmitted to the automatic test equipment 200 through the test board 100 and the tester head 210.

FIG. 3A is a plan view illustrating a test board 100 according to an exemplary embodiment of the present inventive concept.

Referring to FIG. 3A, the test board 100 according to an exemplary embodiment of the present inventive concept may include a plurality of connection regions 110 and a plurality of surface mounted devices 120 formed on a first surface 100S1 of the test board 100.

The plurality of connection regions 110 may be aligned along the X direction. Accordingly, different devices under test DUT (e.g., refer to FIG. t) may be simultaneously connected to the plurality of connection regions 110, respectively. According to an exemplary embodiment of the present inventive concept, each of the connection regions 110 may have a polygonal shape, such as a rectangular planar shape having two edges parallel to the X direction and two edges parallel to the Y direction. The lengths of the connection regions 110 in the X direction and the Y direction may be in a range of about 3 mm to about 5 mm, respectively.

A plurality of connection terminals may be disposed on the plurality of connection regions 110 to make contact with the devices under test DUT (e.g., refer to FIG. 1). For example, the plurality of connection terminals may include a power terminal, a ground terminal, a signal terminal and an output terminal. The power terminal may supply a power supply potential. The ground terminal may provide a reference potential. The signal terminal may apply a test signal, and the output terminal may apply analog output signals of the devices under test DUT (e.g., refer to FIG. 1). According to an exemplary embodiment of the present inventive concept, each of the plurality of connection terminals may have a pad shape.

The surface-mounted devices 120 may include passive elements (such as resistors, inductors, and capacitors), active elements (such as diodes, bi-polar junction transistors, and power transistors), IC circuits (such as buffers), and connectors.

According to an exemplary embodiment of the present inventive concept, passive elements such as resistors, inductors, and capacitors among the surface-mounted devices 120 may be disposed adjacent to the connection regions 110. A distance between the connection regions 110 and passive elements such as resistors, inductors, and capacitors among the surface-mounted elements 120 may be about 10 mm or less. Accordingly, the devices under test DUT (refer to FIG. 1) may be tested under substantially the same conditions as the mounting environment in an actual application, and reliability of the test may be increased.

According to an exemplary embodiment of the present inventive concept, an analog input such as a reference potential and a power supply potential may be applied to the connection terminals through passive elements such as a resistor, an inductor, and a capacitor. According to an exemplary embodiment of the present inventive concept, analog output signals such as output voltages of the devices under test DUT (refer to FIG. 1) may be output through passive elements such as resistors, inductors, and capacitors. Accordingly, passive elements such as a resistor, an inductor, and a capacitor among the surface-mounted devices 120 may be disposed adjacent to edges parallel to the X direction of each of the connection regions 110. For example, passive elements such as a resistor, an inductor, and a capacitor among the surface-mounted elements 120 may be disposed along only edges parallel to the X direction of each of the connection regions 110. For example, passive elements such as resistors, inductors, and capacitors among the surface-mounted devices 120 may not be disposed adjacent to edges parallel to the Y direction of each of the connection regions 110. According to an exemplary embodiment of the present inventive concept, the surface mounted devices 120 may not be interposed between the different connection regions 110. However, the present inventive concept is not limited thereto, and for example, the surface mounted devices 120 may be disposed along edges parallel to the X direction and Y direction of each of the connection regions 110.

Accordingly, the distance between the different connection regions 110 in the X direction may be reduced by a distance substantially equal to the width of the scribe lane, which is a separation space between the devices under test DUT (refer to FIG. 2). For example, the distance in the X direction between the adjacent connection regions 110 may be in a range of about 10 µm to about 200 µm. Accordingly, a large number of connection regions 110 may be provided so that a test may be performed without skipping some of the devices under test DUT (refer to FIG. 2) formed along the X direction.

Figure 3B:
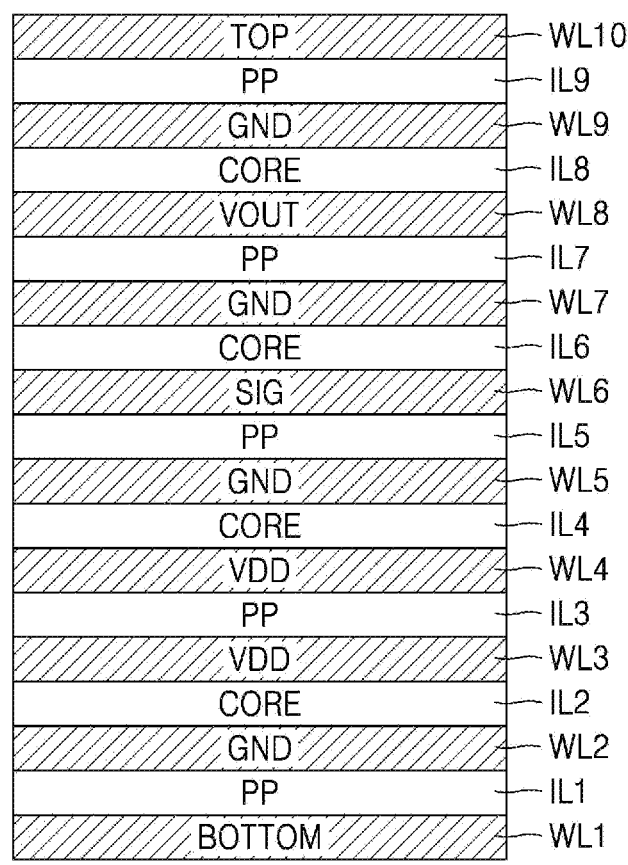
FIG. 3B is a schematic diagram illustrating a cross-sectional structure of a test board according to an exemplary embodiment of the present inventive concept.

FIG. 3B is a schematic diagram illustrating a cross-sectional structure of a test board 100 according to an exemplary embodiment of the present inventive concept.

Referring to FIG. 3B, the test board 100 may include a plurality of wiring layers WL1 to WL10 and insulating layers IL1 to IL9. Some wiring layers WL2, WL5, WL7, and WL9 among the plurality of wiring layers WL1 to WL10 may be ground planes for providing a reference potential GND. Some other wiring layers WL3 and WL4 may be a power plane for providing a power supply potential VDD to devices under test DUT (refer to FIG. 1). Some other wiring layers WL6 may include a pattern for providing a test signal SIG to a device under test DUT (refer to FIG. 1), and some other wiring layers WL8 may include a pattern for detecting an output voltage VOUT output by the device under test DUT (refer to FIG. 1).

Conductive patterns may be made of at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and graphene, or a metal alloy thereof.

The lowermost wiring layer WL1 may provide pads for contacting the device under test DUT (refer to FIG. 1) and pads for contacting the surface-mounted devices 120 (refer to FIG. 1). The uppermost wiring layer WL10 may provide a connection between the tester head 210 (refer to FIG. 2) and the automatic test equipment 200 (refer to FIG. 2).

According to an exemplary embodiment of the present inventive concept, a wiring layer WL9 may be provided between the wiring layer WL8 for detecting an output voltage for providing the test signal SIG and the wiring layer WL10 of the uppermost layer. A wiring layer WL7 may be provided between the wiring layer WL6 for providing the test signal SIG and the wiring layer WL8 for detecting the output voltage, and a wiring layer WL5 may be provided between the wiring layers WL3 and WL4 for providing the power supply potential VDD and the wiring layer WL6 for providing the test signal SIG. Accordingly, continuity of the impedance of the test board 100 can be ensured and crosstalk between the wiring layers WL3, WL4, WL6, WL8, and WL10 can be prevented. In addition, above and below the wiring layers WL4 and WL3 for providing a power supply potential VDD to the device under test DUT (refer to FIG. 1) wiring layers WL5 and WL2 for providing a reference potential may be provided, respectively. Accordingly, the impedance of the test board 100 may be lowered.

Each of the plurality of insulating layers IL1 to IL9 may be interposed between two adjacent wiring layers among the wiring layers WL1 to WL10. For example, the insulating layers IL1 to IL9 and the wiring layers WL1 to WL10 may be alternately stacked on one another. Among the insulating layers IL1 to IL9, the insulating layers IL1, IL3, IL5, IL7, and IL9 disposed in an odd number may include resin materials such as pre-impregnated material (prepreg), and the insulating layers IL2, IL4, IL6, and IL7 disposed in an even number may be a core layer, but the present inventive concept is not limited thereto. For example, the core layer may include a resin material such as a phenol resin, an epoxy resin, and a polyimide, and/or a glass fiber. For example, the glass fiber is one of the reinforcing substrates, and may be processed by focusing several hundred of strands of glass filaments of about 5 µm to about 25 µm, which are spun by high temperature melting. The glass filaments may be an ore-processed product containing silica as a main component. Glass fibers may have relatively high heat resistance, mechanical strength and electrical insulation. For example, a conductive via connecting two adjacent wiring layers among the plurality of wiring layers WL1 to WL10 may be formed in the plurality of insulating layers IL1 to IL9.

The stacking order of the plurality of wiring layers WL1 to WL10 and the plurality of insulating layers IL1 to IL9 shown in FIG. 3B is example, and does not limit the present inventive concept. For example, the test board 100 may further include a plurality of core layers and insulating layers for reinforcing rigidity, or may include additional wiring layers according to the complexity of the wiring. In an exemplary embodiment of the present inventive concept, some of the plurality of wiring layers WL1 to WL10 may be omitted. In addition, the stacking order according to the function of the wiring layers WL1 to WL10 may be arbitrary.

Figure 4A:
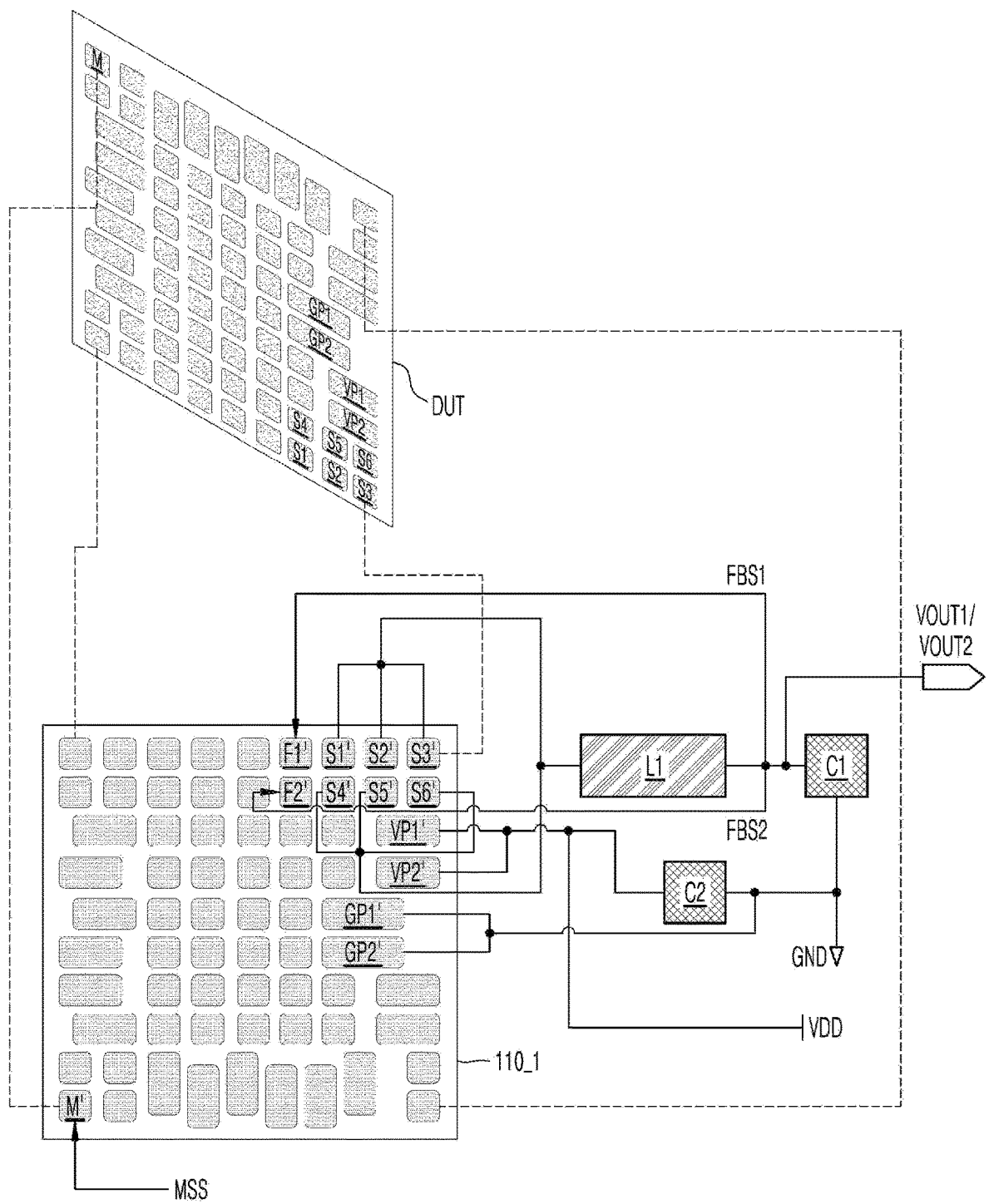
FIGS. 4A and 4B are schematic diagrams illustrating a test board according to an exemplary embodiment of the present inventive concept.
Figure 4B:
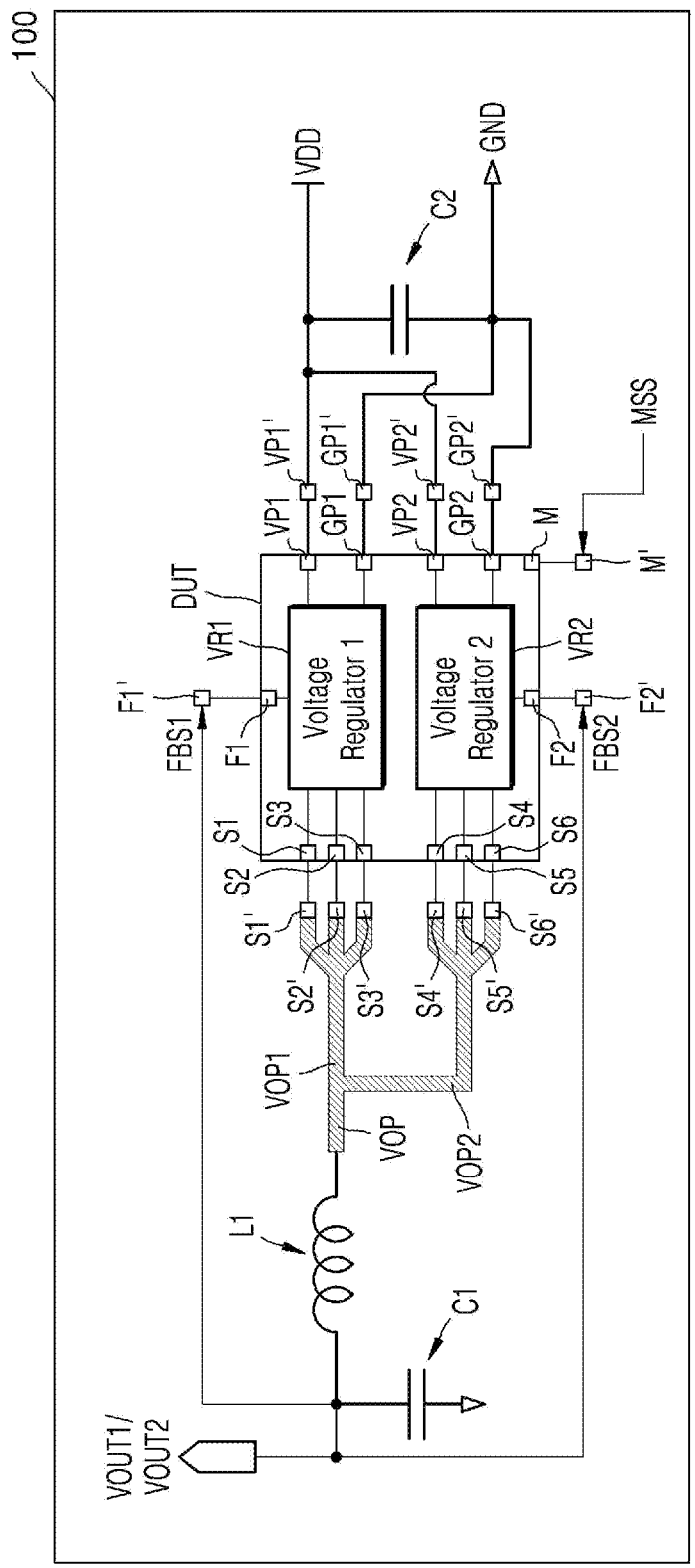

FIGS. 4A to 4B are schematic diagrams illustrating a test board 100 according to an exemplary embodiment of the present inventive concept.

For example, FIG. 4A illustrates a connection relationship between the connection region 110 on the test board 100 and the passive elements included in the surface mounted devices 120 and the device under test DUT, and FIG. 4B illustrates a connection relationship between the voltage regulators VR1 and VR2 included in the device under test DUT and the passive elements included in the surface mounted devices 120.

Referring to FIG. 4A, the device under test DUT may include a plurality of connection terminals. For example, the plurality of connection terminals of the device under test DUT may be pads. The plurality of connection terminals of the device under test DUT may include, for example, output terminals S1, S2, S3, S4, S5, and S6, feedback terminals F1 and F2, power terminals VP1 and VP2, reference terminals GP1 and GP2, and a mode selection terminal M. A plurality of connection terminals may be disposed in the connection region 110 of the test board 100. For example, a plurality of connection terminals in the connection region 110 may be pads. The plurality of connection terminals in the connection region 110 may include, for example, output terminals S1', S2', S3', S4', S5', and S6', feedback terminals F1' and F2', and power terminals VP1' and VP2', reference terminals GP1' and GP2', and a mode selection terminal M'.

The terminals of the device under test DUT may be connected to a plurality of connection terminals in the connection region 110 through the test socket 330 (refer to FIG. 2). For example, the output terminals S1, S2, S3, S4, S5, and S6 may be connected to the output terminals S1', S2', S3', S4', S5', and S6' in order, respectively. As an additional example, the feedback terminals F1 and F2 may be connected to the feedback terminals F1' and F2' in order, respectively. For example, the power terminals VP1 and VP2 may be connected to the power terminals VP1' and VP2' in order, respectively. As another example, the reference terminals GP1 and GP2 may be connected to the reference terminals GP1' and GP2' in order, respectively, and the mode selection terminal M may be connected to the mode selection terminal M'. The broken lines in FIG. 4A indicate the correspondence between the connection terminals on the device under test DUT and the connection terminals in the connection region 110.

The surface mounted device 120 (refer to FIG. 3A) may include an inductor L1 and capacitors C1 and C2. For example, the inductor L1 and the capacitors C1 and C2 may be located adjacent to the connection region 110; however, the present inventive concept is not limited thereto. A first terminal of the inductor L1 may be connected to the output terminals S1', S2', S3', S4', S5', and S6' of the connection region 110, and a second terminal of the inductor L1 may be connected to the feedback terminals F1' and F2' of the connection region 110. A first terminal of the first capacitor C1 may be connected to the second terminal of the inductor L1, and a reference potential GND may be applied to a second terminal of the first capacitor C1. The voltage at the first terminal of the first capacitor C1 may be output as the output voltages VOUT1 and VOUT2. The power terminals VP1' and VP2' may be connected to a first terminal of the second capacitor C2, and a power supply potential VDD may be applied to the first terminal of the second capacitor C2. Reference terminals GP1' and GP2' may be connected to a second terminal of the second capacitor C2, and a reference potential GND may be applied to the second terminal of the second capacitor C2.

In an exemplary embodiment of the present inventive concept, some of the output terminals S1', S2', S3', S4', S5', and S6' of the connection region 110 may have different distances from a surface mounted device 120. For example, a distance between a first output terminal S1' and a first surface mounted device 120 may be smaller than a distance between a second output terminal S2' and the first surface mounted device 120.

Referring to 4A and 4B, the output terminals S1, S2, and S3, the feedback terminal F1, the power terminal VP1, and the reference terminal GP1 may be electrically connected to the first voltage regulator VR1. In addition, the output terminals S4, S5, and S6, the feedback terminal F2, the power terminal VP2, and the reference terminal GP2 may be electrically connected to the second voltage regulator VR2.

In FIG. 4B, a voltage output pattern VOP connected to the first terminal of the inductor L1 and first and second voltage output patterns VOP1 and VOP2 branched from the voltage output pattern VOP may be wiring patterns formed in the test board 100 of FIG. 31. According to an exemplary embodiment of the present inventive concept, the voltage output pattern VOP and the first and second voltage output patterns VOP1 and VOP2 may have substantially the same width, but the present inventive concept is not limited thereto. According to an exemplary embodiment of the present inventive concept, lengths of the first and second voltage output patterns VOP1 and VOP2 may be different from each other. The difference in length between the first and second voltage output patterns VOP1 and VOP2 may cause a difference between the impedance viewed from the output terminals S1, S2, and S3 toward the inductor L1 and the impedance viewed from the output terminals S4, S5, and S6 toward the inductor L1. Accordingly, the automatic test equipment 200 (refer to FIG. 1) may correct at least one of a test result for a first voltage regulator VR1 or a test result for a second voltage regulator VR2 based on the difference between the impedances.

Here, as a non-limiting example, the present inventive concept will be described with reference to an exemplary embodiment in which the voltage regulators VR1 and VR2 are buck regulators. However, one of ordinary skill in the art will be able to easily reach a test board for testing a device under test, including various regulators such as an LDO regulator and a boost regulator, based on what is described herein.

The first voltage regulator VR1 may output an output voltage VOUT1 through the output terminals S1, S2, and S3 of the device under test DUT. The first voltage regulator VR1 may sense the output voltage VOUT1 through the feedback terminal F1 and use the sensed output voltage VOUT1 as a feedback signal FBS1. The first voltage regulator VR1 may be supplied with the power supply potential VDD through the power terminal VP1 and with the reference potential GND through the reference terminal GP1.

Similarly, the second voltage regulator VR2 may output the output voltage VOUT2 through the output terminals S4, S5, and S6 of the device under test DUT. The second voltage regulator VR2 may sense the output voltage VOUT2 through the feedback terminal F2 and use the sensed output voltage VOUT2 as a feedback signal FBS2. The second voltage regulator VR2 may be supplied with the power supply potential VDD through the power terminal VP2 and with the reference potential GND through the reference terminal GP2. Accordingly, the first and second voltage regulators VR1 and VR2 may share the inductor L1 and the capacitors C1 and C2. For example, the first and second voltage regulators VR1 and VR2 may be electrically connected to the inductor L1 and the capacitors C1 and C2. According to an exemplary embodiment of the present inventive concept, the first and second voltage regulators VR1 and VR2 may be voltage regulators of the same type. For example, each of the first and second voltage regulators VR1 and VR2 may be a buck regulator. According to an exemplary embodiment of the present inventive concept, the first and second voltage regulators VR1 and VR2 may be different types of voltage regulators, and the capacities of passive elements may be substantially the same.

According to a comparative example, in a conventional test board, to connect a separate passive element to each of the voltage regulators included in the device under test, a plurality of surface mounted devices are provided on the test board. These passive elements are placed very close to the connection region to provide an environment similar to that of when mounted in an actual application. Some passive elements of the plurality of passive elements are disposed between the connection regions due to space limitations on the test board, and the passive elements between the connection regions may widen the spacing between the connection regions. For this reason, an adjacent device under test on the wafer may not be simultaneously tested. Accordingly, since it may not be possible to simultaneously test the devices under test that are adjacent to each other, and since some devices under test may be skipped, the test speed may decrease due to a decrease in the number of devices under test that may be tested at the same time.

According to an exemplary embodiment of the present inventive concept, since the plurality of voltage regulators VR1 and VR2 share the inductor L1 and the capacitors C1 and C2, the number of passive elements disposed adjacent to the connection region 110 may be reduced. Accordingly, as illustrated in FIG. 3A, the surface mounted device 120 may not be interposed between the adjacent connection regions 110. Thus, according to an exemplary embodiment of the present inventive concept, a larger number of connection regions 110 can be provided on the same area, and a larger number of devices under test DUT (refer to FIG. 2) may be simultaneously tested, so that a test speed may be increased.

When the first and second voltage regulators VR1 and VR2 share the inductor L1 and the capacitors C1 and C2, the first and second voltage regulators VR1 and VR2 may be sequentially tested. The first and second voltage regulators VR1 and VR2 may not be tested simultaneously. For example, after a series of tests on the first voltage regulator VR1 are performed, a series of tests on the second voltage regulator VR2 may be performed. According to an exemplary embodiment of the present inventive concept, the automatic test equipment 200 (refer to FIG. 1) may transmit a mode selection signal MSS to the device under test DUT through the mode selection terminal M' and the mode selection terminal M. The mode selection signal MSS may control the device under test DUT so that the first and second voltage regulators VR1 and VR2 sequentially generate output voltages VOUT1 and VOUT2.

The automatic test equipment 200 (refer to FIG. 2) may control the device under test DUT to operate in the test mode by applying the mode selection signal MSS to the mode selection terminal M through the test board 100. In the test mode, even after power is supplied to the device under test DUT and the device under test DUT is switched from an off state to an on state, the logic circuit included in the device under test DUT may control the first and second voltage regulators VR1 and VR2 so that the first and second voltage regulators VR1 and VR2 remain in an off state.

Subsequently, the first and second voltage regulators VR1 and VR2 may be sequentially tested based on the test signal of the automatic test equipment 200. For example, after turning on the first voltage regulator VR1 and testing the first voltage regulator VR1, the automatic test equipment 200 may turn off the first voltage regulator VR1. Subsequently, for example, after turning on the second voltage regulator VR2 and testing the second voltage regulator VR2, the automatic test equipment 200 may turn off the second voltage regulator VR2.

The mode selection described above may be performed using any one of a nonvolatile memory of the device under test DUT and a register memory included in a logic circuit of the device under test DUT. For example, when the mode selection signal is 'HIGH', a register included in the logic circuit of the device under test DUT that determines the outputs of the first and second voltage regulators VR1 and VR2 may have a value of '0'.

In general, during the voltage regulator test, the proportion of time taken for the test using a high current of about 500 mA to about 12 Å is about 70% and the proportion of time taken for testing using a low current of about 500 mA or less is about 30%. On the test board, when a test using a low current is performed, a plurality of voltage regulators may be tested at the same time, but when a test using a high current is performed, each of the plurality of voltage regulators may be tested in sequence due to the limitations of the output current. For example, during majority of the actual test times, the plurality of voltage regulators were not tested simultaneously.

According to an exemplary embodiment of the present inventive concept, a plurality of first and second voltage regulators VR1 and VR2 included in a single device under test DUT may not be simultaneously tested, but a larger number of devices under test DUT, when compared to the related art, can be tested at the same time. According to the experimental example, it was confirmed that the time for testing, while using the test board 100 (refer to FIG. 3A) according to an exemplary embodiment of the present inventive concept, was reduced by about 36% compared to the conventional test board.

Figure 5:
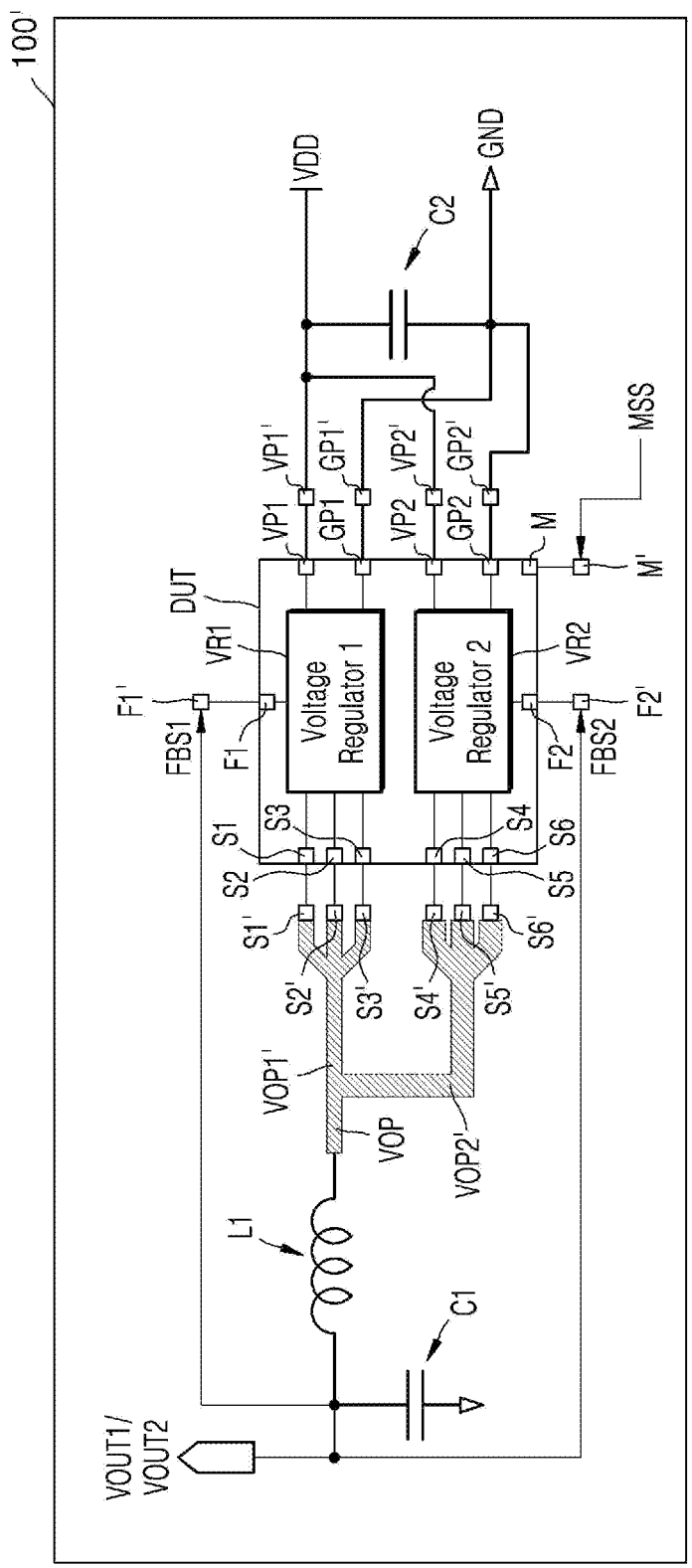
FIG. 5 is a diagram for describing a test board according to an exemplary embodiment of the present inventive concept.

FIG. 5 is a diagram for describing a test board 100' according to an exemplary embodiment of the present inventive concept.

For convenience of explanation, descriptions of elements overlapping with descriptions of elements with reference to FIGS. 3A to 4B may be omitted, and differences will be mainly described.

Referring to FIG. 5, the test board 100' is similar to the test board 100 of FIG. 4B, but may include first and second voltage output patterns VOP1' and VOP2' having different widths from each other. According to an exemplary embodiment of the present inventive concept, the width of the second voltage output pattern VOP2' may be larger than the width of the first voltage output pattern VOP1', but present inventive concept is not limited thereto. For example, the width of the second voltage output pattern VOP2' may be smaller than the width of the first voltage output pattern VOP1'. The length of the electrical path of the second voltage output pattern VOP2' may be larger than that of the electrical path of the first voltage output pattern VOP1'; however, the present inventive concept is not limited thereto. For example, the length of the electrical path of the second voltage output pattern VOP2' may be smaller than that of the electrical path of the first voltage output pattern VOP1'.

According to an exemplary embodiment of the present inventive concept, by making the widths of the first and second voltage output patterns VOP1' and VOP2' different from each other, each of the impedance viewed from the output terminals S1, S2, and S3 and the impedance viewed from the output terminals S4, S5, and S6 may be substantially the same as the impedance when the device under test DUT is mounted in the application. Accordingly, reliability of a test using the test board 100' may be increased.

Figure 6:
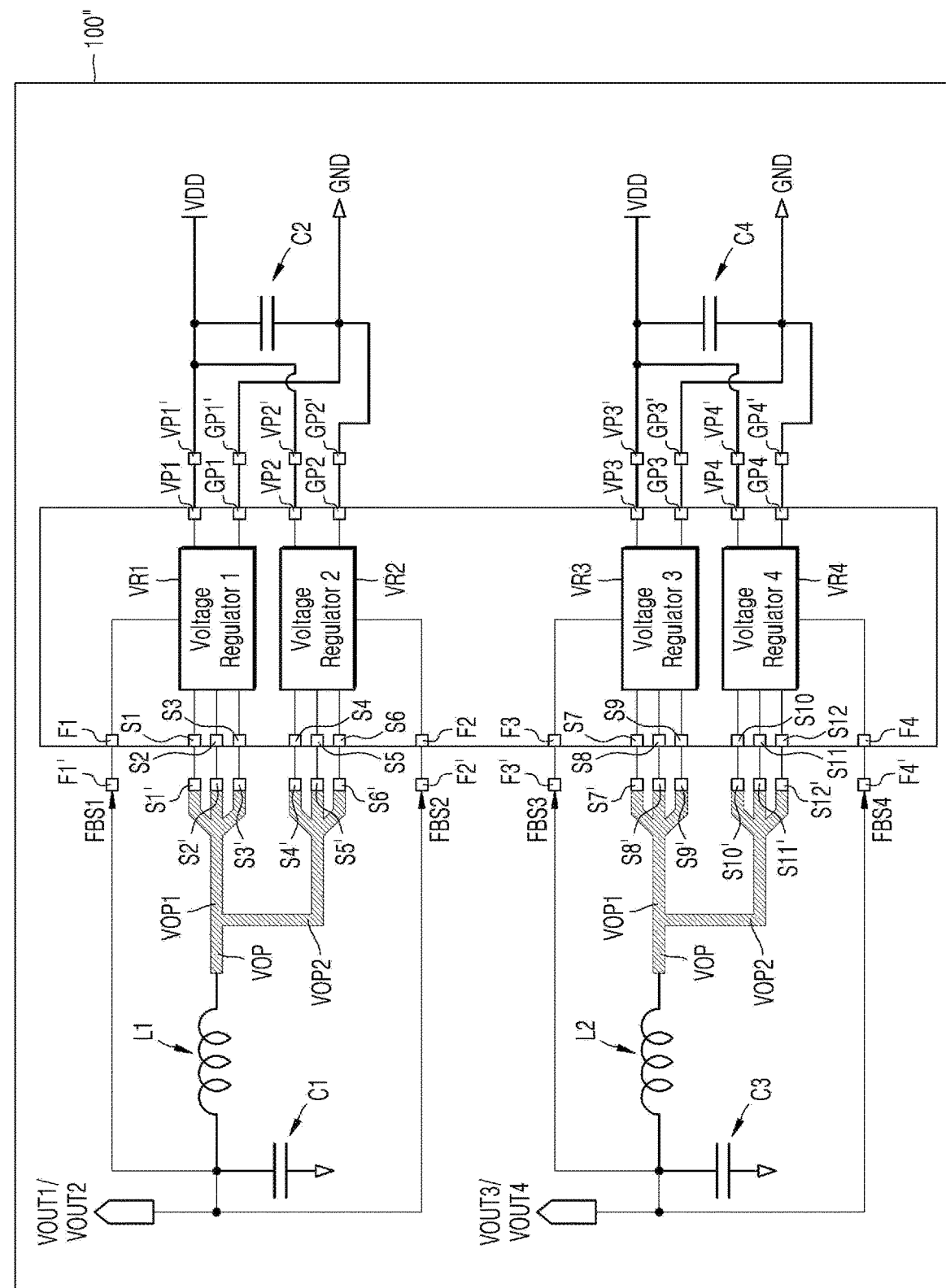
FIG. 6 is a diagram for describing a test board according to an exemplary embodiment of the present inventive concept.

FIG. 6 is a diagram for describing a test board 100" according to an exemplary embodiment of the present inventive concept.

For convenience of explanation, descriptions of elements overlapping with descriptions of elements with reference to FIGS. 3A to 4B may be omitted, and differences will be mainly described.

Referring to FIG. 6, unlike the device under test DUT of FIG. 4B, the device under test DUT" may further include third to fourth voltage regulators VR3 and VR4, output terminals S7, S8, S9, S10, S11, and S12, feedback terminals F3 and F4, power terminals VP3 and VP4, and reference terminals GP3 and GP4. The output terminals S7, S8, and S9, the feedback terminal F3, the power terminal VP3, and the reference terminal GP3 may be connected to the third voltage regulator VR3, and the output terminals S10, S11, and S12, the feedback terminal F4, the power terminal VP4, and the reference terminal GP4 may be connected to the fourth voltage regulator VR4.

Unlike the test board 100 of FIG. 4B, the test board 100" may further include an inductor L2, capacitors C3 and C4, output terminals S7', S8', S9', S10', S11', and S12', feedback terminals F3' and F4', power terminals VP3' and VP4', and reference terminals GP3' and GP4' The inductor L2 and the capacitors C3 and C4 may be surface mounted devices.

The output terminals S7, S8, S9, S10, S11, and S12 may be connected to the output terminals S7', S8', S9', S10', S11', and S12' in order, respectively. The feedback terminals F3 and F4 may be connected to the feedback terminals F3' and F4' in order, respectively. The power terminals VP3 and VP4 are connected to the power terminals VP3' and VP4' in order, respectively, and the reference terminals GP3 and GP4 may be connected to the reference terminals GP3' and GP4' in order, respectively.

A first terminal of the inductor L2 may be connected to the output terminals S7', S8', S9', S10', S11', and S12', and a second terminal of the inductor L2 may be connected to the feedback terminals F3' and F4'. A first terminal of the third capacitor C3 may be connected to the second terminal of the inductor L2, and a reference potential GND may be applied to a second terminal of the third capacitor C3. The voltage at the first terminal of the third capacitor C3 may be output as the output voltages VOUT3 and VOUT4. The power terminals VP3' and VP4' may be connected to a first terminal of the fourth capacitor C4, and a power supply potential VDD may be applied to the first terminal of the fourth capacitor C4. The reference terminals GP3' and GP4' may be connected to a second terminal of the fourth capacitor C4, and a reference potential GND may be applied to the second terminal of the fourth capacitor C4.

A voltage output pattern VOP connected to the first terminal of the inductor L2, and first and second voltage output patterns VOP1 and VOP2 branched from the voltage output pattern VOP may be wiring patterns formed in the test board 100 (refer to FIG. 3B). According to an exemplary embodiment of the present inventive concept, the voltage output pattern VOP, which is connected to the inductor L2, and the first and second voltage output patterns VOP1 and VOP2, which are branched from the voltage output pattern VOP, may have substantially the same width as each other, but the present inventive concept is not limited thereto.

The third voltage regulator VR3 may output an output voltage VOUT3 through the output terminals S7, S8, and S9. The third voltage regulator VR3 may sense the output voltage VOUT3 through the feedback terminal F3 and use the sensed output voltage VOUT3 as a feedback signal FBS3. The third voltage regulator VR3 may be supplied with the power supply potential VDD through the power terminal VP3 and with the reference potential GND through a reference terminal GP3.

The fourth voltage regulator VR4 may output an output voltage VOUT4 through the output terminals S10, S11, and S12. The fourth voltage regulator VR4 may sense the output voltage VOUT4 through the feedback terminal F4 and use the sensed output voltage VOUT4 as a feedback signal FBS4. The fourth voltage regulator VR4 may be supplied with the power supply potential VDD through the power terminal VP4 and with the reference potential GND through the reference terminal GP4.

In FIG. 6, the first to fourth voltage regulators VR1, VR2, VR3, and VR4 may be regulators of the same type. For example, the first to fourth voltage regulators VR1, VR2, VR3, and VR4 may be buck regulators. According to an exemplary embodiment of the present inventive concept, the capacity of the passive elements for the first and second voltage regulators VR1 and VR2 may be different from the capacity of the passive elements for the third and fourth voltage regulators VR3 and VR4. Here, the capacity of the passive element may be, for example, a resistance value of a resistor, an inductance of an inductor, and a capacitance of a capacitor. The test board 100" according to an exemplary embodiment of the present inventive concept provides passive elements commonly connected to a plurality of regulators of the device under test DUT", but may provide various numbers of passive elements according to the desired capacity of the passive elements. Accordingly, the speed and reliability of the test may be increased.

While the present inventive concept has been particularly shown and described with reference to exemplary embodiments thereof, it will be apparent to those of ordinary skill in the art that various changes in form and detail may be made therein without departing from the spirit and scope of the present inventive concept.

What is claimed is:

1. A test board configured to test a device under test, the test board comprising:
   a connection region including first and second connection terminals for contacting the device under test; and
   a first surface mount device located adjacent to the connection region,
   wherein the first connection terminal is configured to be electrically connected to a first voltage regulator of the device under test,
   wherein the second connection terminal is configured to be electrically connected to a second voltage regulator of the device under test, and
   wherein the first surface mount device is configured to be electrically connected to each of the first and second connection terminals, wherein the first surface mount device is electrically connected to a feedback terminal of each of the first and second voltage regulators.

2. The test board of claim 1, wherein a first terminal of the first surface mount device is configured to be connected to an output terminal of each of the first and second voltage regulators, and a second terminal of the first surface mount device is connected to the feedback terminal of each of the first and second voltage regulators.

3. The test board of claim 1, wherein the first surface mount device is a passive element.

4. The test board of claim 1, wherein the first and second voltage regulators are the same type of regulator.

5. The test board of claim 1, wherein the first voltage regulator is a buck regulator, and the second voltage regulator is a low drop-out (LDO) regulator.

6. The test board of claim 1, wherein each of the first connection terminal and second connection terminal is provided as a plurality.

7. The test board of claim 1, wherein the first connection terminal is one of an output terminal, a feedback terminal, a power terminal, or a ground terminal.

8. The test board of claim 1, wherein the connection region includes: a third connection terminal configured to be connected to a third voltage regulator included in the device under test; and a fourth connection terminal configured to be connected to a fourth voltage regulator included in the device under test, and
wherein the test board further includes a second surface mount device located adjacent to the connection region and connected to each of the third and fourth connection terminals.

9. The test board of claim 8, wherein the first to fourth voltage regulators are the same type of regulator.

10. A test board comprising:
a first connection region including a first output terminal and a second output terminal, wherein the first output terminal is configured to receive an output signal from a first voltage regulator of a first device under test, wherein the second output terminal is configured to receive an output signal from a second voltage regulator of the first device under test, and wherein the test board is electrically connected to the first device under test;
a second connection region including a third output terminal and a fourth output terminal, wherein the third output terminal is configured to receive an output signal from a first voltage regulator of a second device under test, and wherein the fourth output terminal is configured to receive an output signal of the second voltage regulator of the second device under test, and wherein the test board is electrically connected to the second device under test;
a first surface mount device located adjacent to the first connection region; and
a second surface mount device located adjacent to the second connection region,
wherein the first surface mount device is connected to each of the first and second output terminals,
wherein the second surface mount device is connected to each of the first and second output terminals,
wherein the first surface mount device is electrically connected to a feedback terminal of each of the first and second voltage regulators of the first device under test, and
wherein the second surface mount device is electrically connected to a feedback terminal of each of the first and second voltage regulators of the second device under test.

11. The test board of claim 10, wherein the first and second surface mount devices are not interposed between the first and second connection regions.

12. The test board of claim 10, wherein each of the first and second connection regions has a polygonal shape,
the first surface mount device is provided as a plurality, and the plurality of first surface mount devices are aligned along an edge of the first connection region, and
the second surface mount device is provided as a plurality, and the plurality of second surface mount devices are aligned along an edge of the second connection region.

13. The test board of claim 10, wherein a distance between the first output terminal and the first surface mount device is smaller than a distance between the second output terminal and the first surface mount device, and
a width of a first signal line connecting the first output terminal and the first surface mount device is different from a width of a second signal line connecting the second output terminal and the first surface mount device.

14. The test board of claim 13, wherein the width of the first signal line is smaller than the width of the second signal line.

15. The test board of claim 11, wherein a distance between the first and second connection regions is in a range of 10 μm to 200 μm.

16. A semiconductor device test system comprising:
a test board configured to be electrically connected to a device under test; and
an automatic test circuit configured to provide a power supply potential and a reference potential to the test board, and to determine a defect of the device under test based on a received analog output voltage from the device under test;
wherein the test board comprises:
a first connection region located on the test board and including a plurality of connection terminals; and
a first passive element located adjacent to the first connection region on the test board,
wherein the plurality of connection terminals include a plurality of power terminals configured to receive the power supply potential, a plurality of reference terminals configured to receive the reference potential, and a plurality of output terminals configured to receive the analog output voltage,
wherein the first passive element is connected to each of the plurality of output terminals,
wherein the device under test includes first and second voltage regulators, and
wherein the plurality of output terminals include first output terminals and second output terminals, wherein the first output terminals are configured to be electrically connected to the first voltage regulators, and the second output terminals are configured to be electrically connected to the second voltage regulators, and
wherein the first connection region further includes a mode selection terminal, and
wherein the automatic test circuit is configured to apply a mode selection signal to the mode selection terminal to keep the first and second voltage regulators included in the device under test in an off state when power is supplied to the device under test in an off state.

17. The semiconductor device test system of claim 16, wherein the test board further includes a second passive element located adjacent to the first connection region on the test board, and
wherein a first terminal of the second passive element is connected to the plurality of power terminals, and a second terminal of the second passive element is connected to the plurality of reference terminals.

18. The semiconductor device test system of claim 16, wherein the test board further includes a second connection region located adjacent to the first connection region, and
a distance between the first and second connection regions is in a range of 10 μm to 200 μm.

* * * * *